(12) United States Patent
Chen et al.

(10) Patent No.: US 11,364,496 B2
(45) Date of Patent: Jun. 21, 2022

(54) COPLANAR FLUIDIC INTERCONNECT

(71) Applicant: HEWLETT-PACKARD DEVELOPMENT COMPANY, L.P., Spring, TX (US)

(72) Inventors: Chien-Hua Chen, Corvallis, OR (US); Michael W. Cumbie, Corvallis, OR (US); Viktor Shkolnikov, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 213 days.

(21) Appl. No.: 16/494,160

(22) PCT Filed: Apr. 21, 2017

(86) PCT No.: PCT/US2017/028825
§ 371 (c)(1),
(2) Date: Sep. 13, 2019

(87) PCT Pub. No.: WO2018/194651
PCT Pub. Date: Oct. 25, 2018

(65) Prior Publication Data
US 2020/0070160 A1    Mar. 5, 2020

(51) Int. Cl.
*B01L 3/00*    (2006.01)
(52) U.S. Cl.
CPC . *B01L 3/502715* (2013.01); *B01L 2300/0877* (2013.01); *B01L 2300/12* (2013.01)
(58) Field of Classification Search
CPC .. B01L 3/502715; B01L 3/5027; B01L 3/502; B01L 3/50; B01L 2300/0877; B01L 2300/08; B01L 2300/12

USPC .................................................. 422/502, 500
See application file for complete search history.

(56) References Cited

U.S. PATENT DOCUMENTS

| 6,548,895 | B1 | 4/2003 | Benavides |
| 6,790,011 | B1 | 9/2004 | Le Pesant |
| 6,821,819 | B1 * | 11/2004 | Benavides ............ H01L 23/473 438/122 |
| 7,524,464 | B2 | 4/2009 | Chong |
| 7,547,380 | B2 | 6/2009 | Velev |

(Continued)

FOREIGN PATENT DOCUMENTS

| CN | 1499949 | 5/2004 |
| CN | 103170383 | 6/2013 |

(Continued)

OTHER PUBLICATIONS

Brown; "An Experimental Validation of the Pressure Capacity of a Modular Gasketless Microfludic Interconnect." 18th Int. Conf. on Miniaturized Systems for Chemistry and Life Sciences; Oct. 26-30, 2014.

(Continued)

*Primary Examiner* — Christine T Mui
(74) *Attorney, Agent, or Firm* — Fabian VanCott

(57) ABSTRACT

An apparatus includes a polymer base layer having a surface. A die has a surface that is substantially coplanar with the surface of the polymer base layer. The die includes a fluidic actuator to control fluid flow across the surface of the die. A fluidic channel is coupled to the polymer base layer to provide a fluidic interconnect between the die and a fluidic input/output port.

20 Claims, 7 Drawing Sheets

(56) References Cited

U.S. PATENT DOCUMENTS

| | | | |
|---|---|---|---|
| 7,658,829 B2 | 2/2010 | Kanagasaba | |
| 7,682,817 B2 | 3/2010 | Cohen | |
| 7,754,150 B2 | 7/2010 | Wada | |
| 8,021,961 B2 | 9/2011 | Sparks | |
| 8,403,557 B2 | 3/2013 | Li | |
| 9,481,945 B2 | 1/2016 | Junket | |
| 9,421,544 B2 | 8/2016 | Wang | |
| 2003/0153119 A1 | 8/2003 | Nathan | |
| 2003/183525 A1 | 10/2003 | Elrod | |
| 2003/0215335 A1 | 11/2003 | Crivelli | |
| 2004/0028566 A1 | 2/2004 | Ko | |
| 2004/0163958 A1 | 8/2004 | Hung | |
| 2005/0196321 A1 | 9/2005 | Huang | |
| 2007/0286773 A1* | 12/2007 | Schlautmann | G01N 27/44791 422/68.1 |
| 2008/0169197 A1 | 7/2008 | McRuer | |
| 2008/0199362 A1 | 8/2008 | Chong | |
| 2008/0210306 A1* | 9/2008 | Xie | G01F 1/6845 137/13 |
| 2009/0326279 A1 | 12/2009 | Tonkovich | |
| 2010/0018584 A1 | 1/2010 | Bransky | |
| 2010/0181195 A1 | 7/2010 | Garcia Tello | |
| 2011/0020141 A1 | 1/2011 | Van Zon | |
| 2011/0220505 A1 | 9/2011 | Wang | |
| 2012/0298233 A1 | 11/2012 | Rothacher | |
| 2013/0118901 A1 | 5/2013 | Pollak | |
| 2013/0121892 A1 | 5/2013 | Fuhrmann | |
| 2013/0206597 A1 | 8/2013 | Wang | |
| 2014/0051159 A1 | 2/2014 | Bergstedt | |
| 2014/0083858 A1 | 3/2014 | Teh | |
| 2015/0001083 A1 | 1/2015 | Martin | |
| 2015/0306598 A1 | 10/2015 | Khandros | |
| 2016/0296929 A1 | 10/2016 | Chen | |
| 2017/0141278 A1 | 5/2017 | Hamaguchi | |
| 2018/0015460 A1 | 1/2018 | Sells et al. | |

FOREIGN PATENT DOCUMENTS

| | | |
|---|---|---|
| CN | 104603595 | 5/2015 |
| CN | 105916689 | 8/2016 |
| DE | 102004011667 | 11/2005 |
| EP | 1643288 | 4/2006 |
| JP | 3772780 | 10/2003 |
| JP | 2004000935 | 1/2004 |
| JP | 2005292092 | 10/2005 |
| JP | 2010539503 | 12/2010 |
| JP | 2012112724 | 6/2012 |
| JP | 2016153725 | 8/2016 |
| TW | 200534916 | 11/2005 |
| TW | 200911375 | 3/2009 |
| TW | 201525464 | 7/2015 |
| WO | WO-2005075081 | 8/2005 |
| WO | WO-2006044966 | 4/2006 |
| WO | WO-2009004533 | 1/2009 |
| WO | WO-2012085728 | 6/2012 |
| WO | WO-2014165373 | 10/2014 |
| WO | WO-2015019520 | 2/2015 |
| WO | WO-2016111251 | 7/2016 |
| WO | WO-2016122554 | 8/2016 |
| WO | WO-2016122572 | 8/2016 |

OTHER PUBLICATIONS

Jung; "A Novel Actuation Method of Transporting Droplets by Using Electrical Charging of Droplet in a Dielectric Fluid"; Biomicrofluidics; Apr. 20, 2009.

Zhou; "One-step Injection Molding of Oste+ Microfluidic Devices with Screw Threaded Ports", 2014, < http://www.rsc.org/images/loc/2014/PDFs/Papers/553_0787.pdf>.

Wood; "Microfabricated High-throughput Electronic Particle Detector", < http://clelandlab.uchicago.edu/pdf/wood%20requa%20rsi%202007.pdf >, Oct. 5, 2007.

Xu; "A Droplet-manipulation Method for Achieving High-throughput in Cross-referencing-based Digital Microfluidic Biochips", Nov. 11, 2008.

Le; "Fabrication of 25 M-filter Microfluidic Chip on Silicon Substrate", 2017, < http://iopscience.iop.org/article/10.1088/2043-6254/8/1/015003/pdf >.

Shih-Kang Fan; "Droplet-on-a-Wristband: Chip-to-Chip Digital Microfluidic Interfaces Between Replaceable and Flexible Electrowetting Modules"; Lab Chip, 2011, pp. 343-347.

* cited by examiner

COPLANAR FLUIDIC INTERCONNECT

BACKGROUND

Fluid processing systems can be constructed in very small packages and are sometimes referred to as lab-on-a-chip. These systems can be based upon micromanipulation of discrete fluid droplets on micro-liter or smaller scales. Thus, micro-fluidic processing can be performed on unit-sized packets of fluid that are then transported, stored, mixed, reacted, and/or analyzed in a discrete manner using a standard set of basic fluid control instructions. These basic fluid control instructions can be combined and reused within hierarchical design structures such that more complex fluid processing procedures (e.g., chemical synthesis or biological assays) can be constructed.

DETAILED DESCRIPTION

A fluid interconnect is provided that allows fluid droplet manipulation of larger droplets to be exchanged via user-accessible fluidic input/output (I/O) ports. Smaller portions of the fluid can be routed from the I/O ports via active fluidic components and can be digitally controlled via integrated dies (e.g., silicon dies with active fluidic control elements) for more precise (e.g., pico-liter, nano-liter, and/or micro-liter) processing of the fluids. A hybrid construction of the fluid interconnect includes a base layer of a polymer or copolymer into which a smaller silicon die resides. A coplanar construction is provided at the interconnect where the base layer and the die are integrated such that a substantially smooth fluid routing surface is provided to mitigate impediments to fluid flow across the die. The die has a surface that is substantially coplanar with a surface of the base layer. The die includes a fluidic actuator (e.g., pump, capillary control, electrode control) to control fluid flow across the surface of the die and relative to a fluidic channel. The fluidic channel can be coupled to the base layer (or integrated therein) to provide a fluidic interconnect between the die and the channel.

Rather than constructing the base out of silicon, as in previous implementations, the base can be constructed of a less expensive material (e.g., epoxy material, polymer, or copolymer) while providing fluidic control via a smaller integrated die that resides in the base layer.

Figure 1:
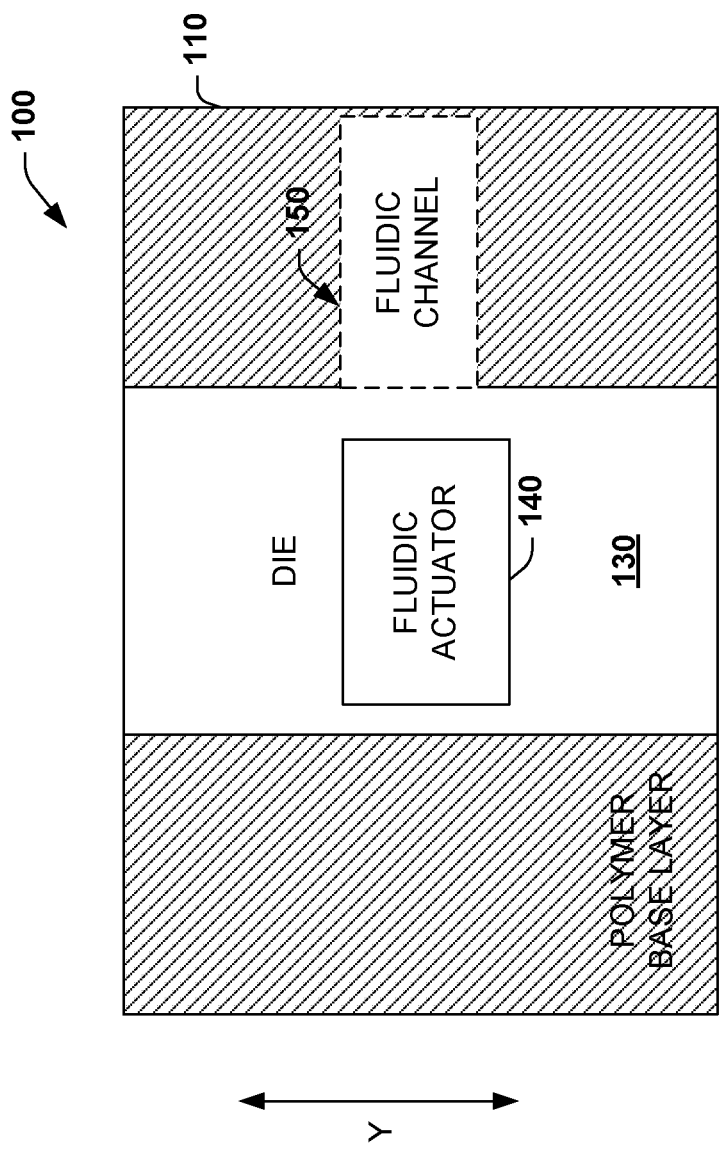
FIG. 1 illustrates a top view of an example apparatus to provide a coplanar fluidic interconnect.

FIG. 1 illustrates a top view of an example apparatus 100 to provide a coplanar fluidic interconnect. The apparatus 100 includes a base layer 110 that provides a substrate to support a fluid flow assembly (e.g., integrated assembly for routing and/or mixing fluids). The base layer 110 can provide a substrate composed of a single material (e.g., polymer resin) or can provide a substrate assembly of more than one material (e.g., layered materials forming the base layer). In one example, the base layer can be formed as an epoxy molding compound (EMC), such as a thermosetting epoxy polymer resin material (e.g., catalog no. CEL400ZHF40WG from Hitachi, Inc.). An example amount of epoxy molding material to fabricate a base layer to support a 30 mm×30 mm substrate size is about two grams.

A die 130 includes side edges that extend longitudinally (along Y axis) between spaced ends of the die. Each side edge of the die 130 forms a coplanar surface with the polymer base layer 110 that contact each adjacent edge of the polymer base layer. In one example, the base layer 110 can be molded over the die to form a coplanar smooth transition at the perimeter of the die surface and base layer surface (see e.g., FIGS. 8-12). In another example, the die 130 can be inserted into a recessed portion of the base layer to form a coplanar surface (see e.g., FIG. 13). The die 130 can include circuitry and one or more fluid actuators 140.

As used herein, the term "substantially coplanar" refers to aligning the top surface of the die 130 with the top surface of the base layer 110 such that substantially no impediment to fluid flow occurs at the juncture between the two surfaces and from an interconnect formed between an input/output port and the die. Example fabrication processes are described herein with respect to FIGS. 8-13 to provide the coplanar construction. Such coplanar fabrication allows the base layer 110 to be fabricated out of a less expensive material (as opposed to being the same material as the die) while the die 130 which includes fluidic flow controls described herein can have its area minimized to reduce overall assembly costs. As shown, the die 130 includes a fluidic actuator 140 to control fluid flow across the surface of the die. Example fluids that can be controlled across the surface of the die 130 can include biological fluids, reagents, chemicals, aqueous solutions, oils, and sample preparation fluids, for example. The fluidic actuator 140 can be implemented as one or more types of actuators, such as disclosed herein (see, e.g., FIGS. 14-16). A fluidic channel 150 can be coupled to the base layer 110 to provide a co-planar fluidic interconnect between the die 130 and an I/O port at the other end of the channel (see e.g., FIGS. 2-4).

In one example, the base layer 110 can be formed as an Epoxy Molding Compound (EMC). The fluidic channel 150 can be formed in the base layer 110 or formed as a separate layer from the base layer (see e.g., FIGS. 2 and 3). The fluidic channel 150 can be formed in one or more layers of a Cyclic Olefin Polymer (COP) or Cyclic Olefin Copolymer (COC), for example. The fluidic channel 150 can be coupled to the base layer 110 or formed in the base layer. An input/output port (see, e.g., FIGS. 2-6) can be coupled to the fluidic channel 150 and formed of the COP or the COC to exchange fluid with the fluidic channel. At least one other fluidic channel can be coupled to the base layer, which may be formed of COP or COC. The other fluidic channel can be positioned adjacent to the fluid channel 150 and supported by the base layer. In some examples, adjacent pairs of fluid channels may extend from spaced apart I/O ports along coaxial paths that intersect along a central juncture that contains one or more fluidic actuators (see, e.g., FIG. 6). In other examples, adjacent pairs of fluidic channels may extend from spaced apart I/O ports along parallel but spaced apart paths that intersect along a central juncture that contains one or more fluidic actuators (see, e.g., FIG. 5).

In some examples, a Micro-Electro-Mechanical Systems (MEMS) layer can be formed on a surface of the die 130 (see e.g., FIG. 4) to provide a corresponding fluidic actuator. The MEMS layer, if disposed on the die 140 can have a surface that is substantially coplanar with the surface of the base layer 110. At least one other die can be positioned in line with the die in the base layer 110 or positioned at a different angle from the die in the base layer to enable routing of fluids in more than one dimension (see e.g., FIG. 7 where dies are fabricated at right angles to allow fluidic control in multiple dimensions). The die 140 can be formed of silicon substrate although other types of semiconductor are possible. The fluidic actuator 140 can be an electrode actuator, a capillary actuator, or a pump actuator, for example, to control fluid flow across the surface of the die 140. Example base layer and die configurations are illustrated herein with respect to FIGS. 2 though 7. Example fabrication processes for achieving coplanar surfaces via fabrication with dissimilar base layer and die materials are disclosed herein with respect to FIGS. 8-13.

Figure 2:
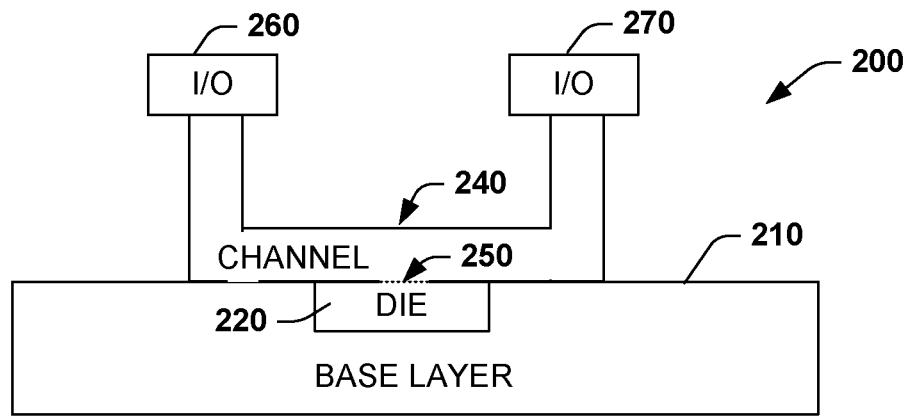
FIG. 2 illustrates a side view of an example apparatus to provide a coplanar fluidic interconnect where a channel is formed on a base layer and a die surface is coplanar with a surface of the base layer.

FIG. 2 illustrates a side view of an example apparatus 200 having a channel to provide a coplanar fluidic interconnect between an I/O port and a die where the channel is formed on a base layer and coplanar to the die surface. The apparatus 200 includes a base layer 210 that provides a substrate to support a fluid flow assembly. A die 220 has a surface that is substantially coplanar with a surface of the base layer 210. A channel 240 is formed on top of the base layer 210 and the die 220. The channel 240 includes an opening 250 to enable fluid flow from the channel to the surface of the die 220. The channel 240 can be molded (e.g., polymer or copolymer materials) or otherwise formed over the die 220 and base layer 210. The channel can include user-accessible input/output (I/O) ports 260 and 270, where fluid can be injected (e.g., via pipette dispenser) into the channel 240 for mixing/routing and/or extracted according to interaction with the one or more fluid actuators of the die 230. In this example, the top surface of the die 220 can be fabricated as substantially coplanar to the top surface of the base layer 210, where the channel 240 is fabricated as a separate layer extending outwardly from the base layer.

Figure 3:
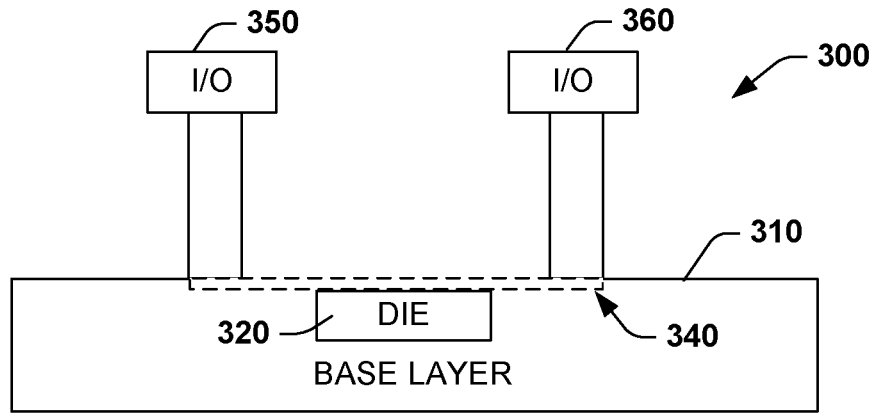
FIG. 3 illustrates a side view of an example apparatus to provide a coplanar fluidic interconnect where a channel is formed within a base layer and a die surface is coplanar with a surface of the base layer.

In the example of FIG. 3, a channel 340 is fabricated as part of the base layer 310. FIG. 3 thus illustrates a side view of an example apparatus 300 to provide a coplanar fluidic interconnect where a channel is formed within a base layer and a die surface is coplanar with a surface of the base layer. The apparatus 300 includes a base layer 310 to support a fluid flow assembly including one or more micro fluidic interconnecting channels that connect input/output ports to a die. A die 320 has a surface that is substantially coplanar with a surface of the base layer 310. In this example, the die 320 is coplanar with a surface of the channel 340, which is fabricated within the base layer 310, to enable fluid flow between the channel to the surface of the die. User-accessible input/output (I/O) ports 350 and 360 can be affixed to the channel 340, where fluid can be injected (e.g., via pipette dispenser) for mixing/routing and/or extracted transport thereof with respect to the die 320 via one or more fluid actuators implemented on the die. In this example, the top surface of the die 320 can be fabricated as substantially coplanar to the top surface of the channel 340 to support fluid flow across the surface of the channel and die, such based on control one or more fluid actuators implemented on the die.

Figure 4:
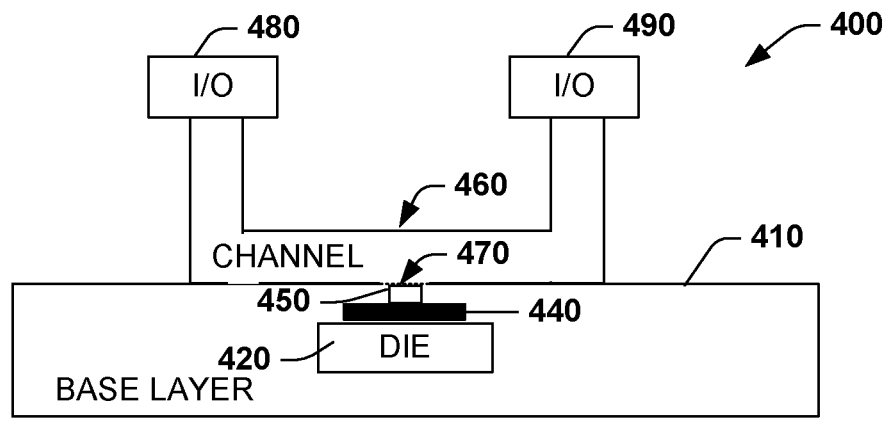
FIG. 4 illustrates a side view of an example apparatus to provide a coplanar fluidic interconnect where a channel is formed on a base layer and a die having a Micro-Electro-Mechanical Systems (MEMS) layer is coplanar with a surface of the base layer.

FIG. 4 illustrates a side view of an example apparatus 400 to provide a coplanar fluidic interconnect between an I/O port and a die where a channel is formed on a base layer 410 and a die 420. In this example, the die 420 includes a Micro-Electro-Mechanical Systems (MEMS) layer 440 that is exposed to the channel and that is coplanar with a surface of the base layer. The base layer 410 supports a fluid flow assembly and the die 420 resides the base layer 410. In this example, the MEMS layer 440 can be fabricated on top of the die 420. The MEMS layer 440 includes a portal 450 for receiving fluid from and sending fluid to an associated channel 460. For example, the portal extends from the MEMS layer 440 to terminate in an end thereof that is connected with and substantially coplanar with a corresponding surface of the channel. The channel 460 includes an opening 470 to allow fluid flow from the channel to the portal 450. The channel 460 can be molded (e.g., polymer or copolymer materials) with user-accessible input/output (I/O) ports 480 and 490, where fluid can be injected (e.g., via pipette dispenser) for mixing/routing and/or extracted after interaction with the MEMS layer 440 via the channel 460. In this example, the MEMS layer 440 can provide the fluidic actuators described herein, such as one or more pumps or capillary controls. The die 420 can include circuitry to provide control signals to control the action of the fluidic actuators implemented on the MEMS layer 440.

Figure 5:
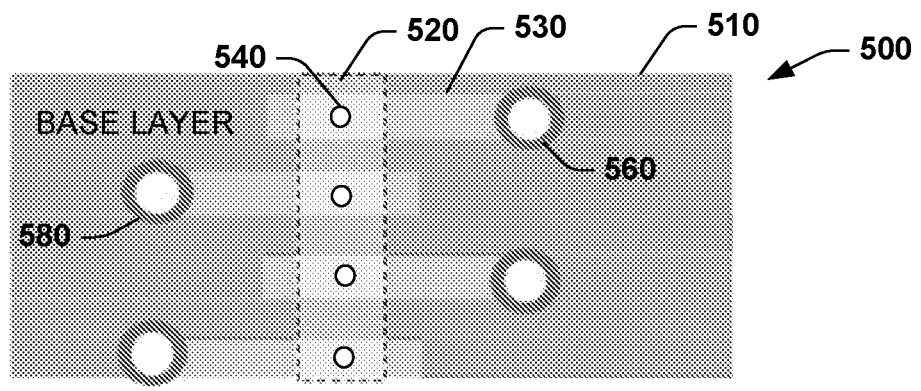
FIG. 5 illustrates a top view of an example apparatus to provide a coplanar fluidic interconnect where the apparatus includes fluidic channels and I/O ports.

FIG. 5 illustrates a top view of an example apparatus 500 to provide a coplanar fluidic interconnect between an input/output port and a die. In this example, the apparatus 500 includes fluidic channels 530 that extend longitudinally in a spaced apart and parallel arrangement. For example, each of the channels 530 have one end fluidly coupled to respective I/O ports 560, 580 at a location that is spaced apart from the recessed portion. Each channel extends from the I/O ports along the base layer to terminate in a spaced apart end that is fluidly coupled with one or more die (not visible in this view). In this example, one set of the I/O ports 560 is arranged on one side of the die receiving region 520 and another set of the I/O ports 580 are arranged on the opposite side of the die, such that the recessed portion is interposed between the sets of I/O ports. Also in the example of FIG. 5, each of the I/O ports and channels are staggered along the length of the die region 520. Each fluidic channel 530 extends from an input/output (I/O) port 560 and is supported by the base layer 510 to provide a fluidic interconnect via a respective I/O port to the die via an opening 540 in the channel (as well as through any other intervening layers).

As in the examples of FIGS. 1-4, the apparatus 500 includes a base layer 510 that supports a fluid flow assembly. The base layer 510 includes a region 520 where one or more die are disposed therein. The die (not visible in this view) reside in the base layer 510 and beneath the fluidic channel 530. The die (or components on top of the die) has a surface that is substantially coplanar with a surface of the base layer 510. The opening 540 fluidly couples each channel 530 to the die within the recessed portion. The fluidic channel 530 is fluidly coupled with the I/O port 560 and supported by the base layer 510 at a location spaced apart from the die. The fluidic channel 530 extends longitudinally from the I/O port 560 to fluidly couple with the die to provide a fluidic interconnect between the die and the I/O port.

Figure 6:
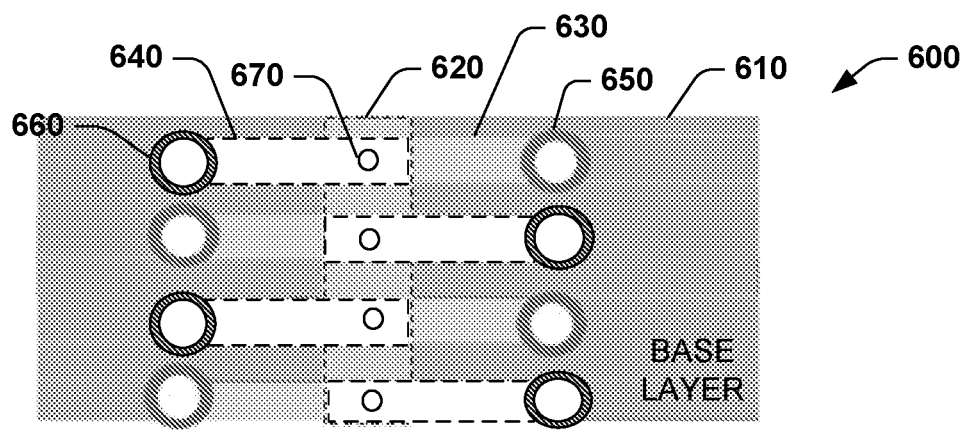
FIG. 6 illustrates a top view of another example apparatus to provide a coplanar fluidic interconnect where the apparatus includes fluidic channels and I/O ports.

FIG. 6 illustrates a top view of another example apparatus 600 to provide a coplanar fluidic interconnect. In this example, a base layer 610 includes a region 620 for one or more dies as described herein. Fluidic channels 630 and 640 can be coupled to I/O ports 650 and 660. Each of the channels 630/640 are fluidly coupled to respective I/O ports 650/650 and extend form such ports to fluidly couple to one or more die via respective openings 670 in the channels. As shown, opposing pair fluid channels 630 and 640 can be co-axially aligned and couple with common fluid openings 670. Although a common opening 670 can be fabricated to provide die access for axially aligned pairs of channels 630, 640, each channel 630 and 640 can be fluidly coupled to the same or separate die disposed in the die receiving region 620 via the same or separate openings.

Figure 7:
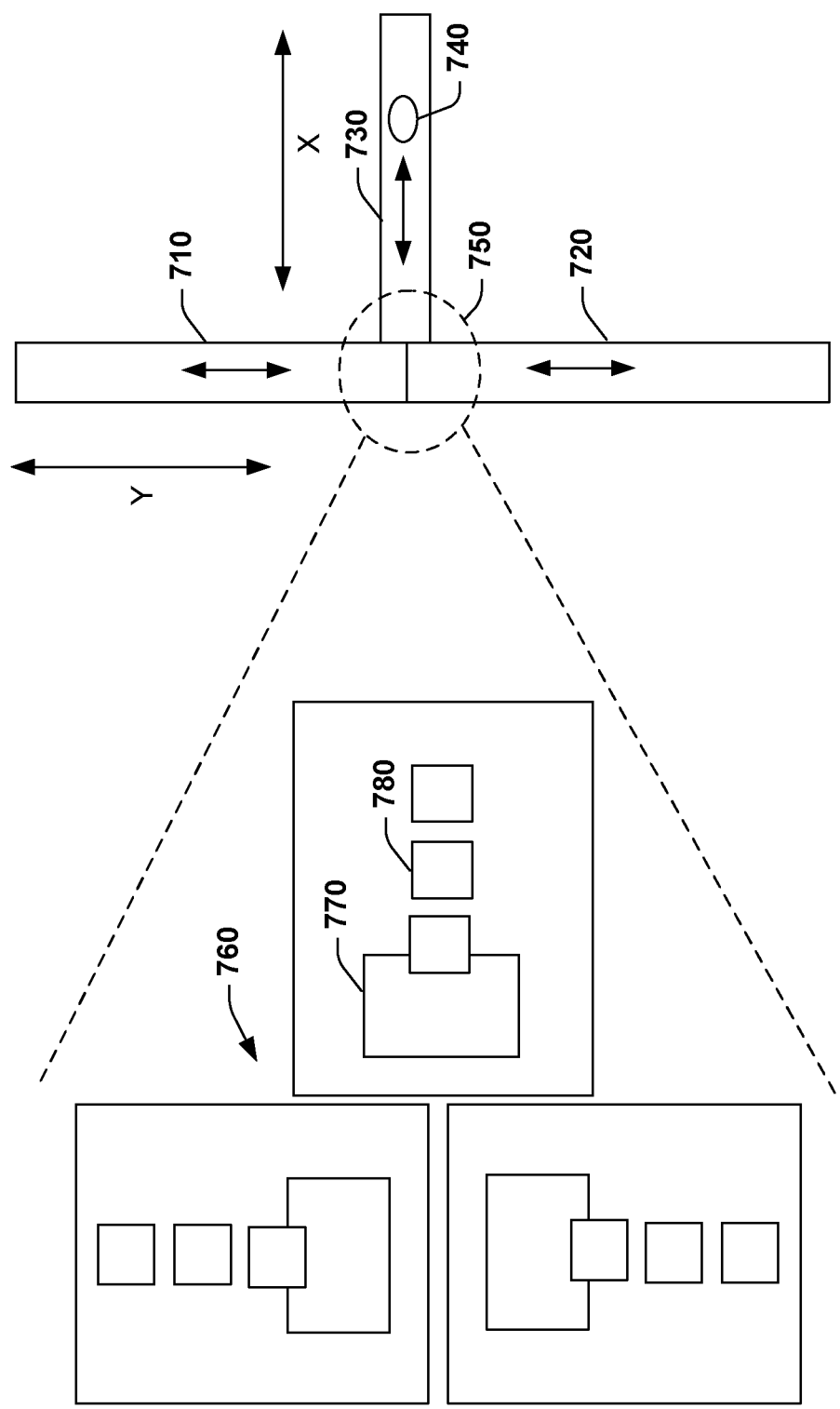
FIG. 7 illustrates a top view of example dies for routing fluids where the dies are positioned along the same or different axis to support fluid movements in multiple dimensions.
Figure 8:
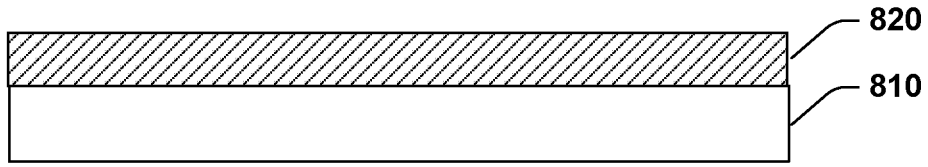
FIGS. 8 through 12 illustrate an example fabrication process for an apparatus having a die that can be formed as a coplanar assembly with a base player.
Figure 9:
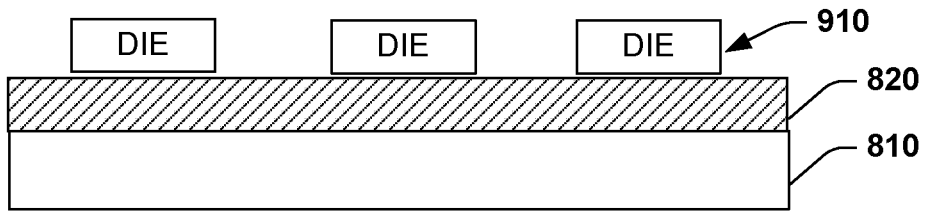

FIG. 7 illustrates a top view of example dies for routing fluids where a plurality of dies 710, 720 and 730 are positioned on different axes (demonstrated as X and Y axes) to support fluid movements in multiple co-planar dimensions. In this example, two dies 710 and 720 are positioned along a Y axis and a third die 730 is positioned along an X axis. A fluid droplet 740 is show being routed along the X axis toward a junction 750 formed by dies 710, 720, and 730. Depending on control signals provided to electrodes disposed on the dies, the fluid droplet 740 can be routed in either direction along the Y axis. An expanded view of the junction 750 is shown at 760 where three dies are positioned to route the droplet 740. As shown, each of the three dies 710, 720, and 730 can include one or more electrodes for routing fluids across the surface of the dies. The electrodes can be similar in size or different in size such as shown at 770 and 780.

FIGS. 8 through 12 illustrate assembly fabrication process to form a die that can be molded to a base layer of different material where the die and the base layer include surfaces that are substantially coplanar. In this example, the die can be formed of a semiconductor material and base layer is formed of a relatively less expensive material (e.g., polymer). To begin the coplanar fabrication process at FIG. 8, a temporary carrier 810 (e.g., ceramic) is provided having a tape lamination layer 820. At FIG. 9 of the coplanar process, one or more dies 910 are attached to the tape lamination surface 820. The dies 910 can be disposed in the die-receiving region via a pick and place integrated circuit placement process, for example.

Figure 10:
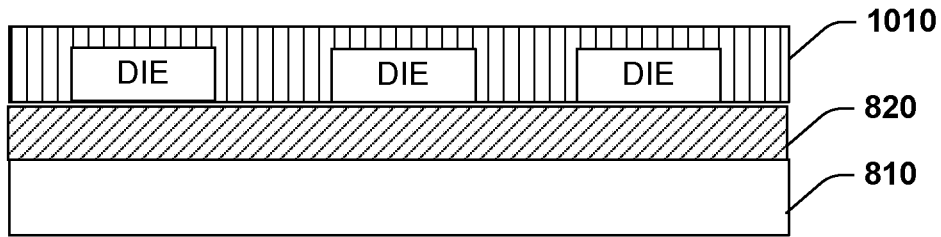
Figure 11:
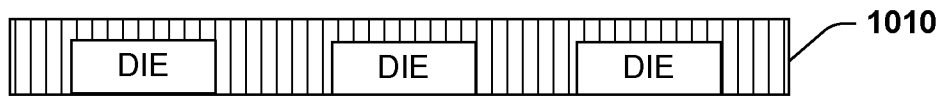
Figure 12:

Proceeding to FIG. 10 of the coplanar fabrication process, a base layer at 1010 can be molded over the dies. The base layer 1010 can include a liquid molding compound such as an epoxy molding compound, for example. Proceeding to FIG. 11 of the coplanar fabrication process, carrier 810 and layer 820 are removed (e.g., de-bonded via heat treatment) after the base layer 1010 has been formed and cured. Proceeding to FIG. 12, a fluidic transport layer 1220 can be attached to the base layer and die assembly of FIG. 11. Although a molding processes is shown FIGS. 8-12 where co-planarity is provided between the die and base layer, an alternative coplanar fabrication process is depicted in FIG. 13 where the die is fitted into a preexisting recessed portion of the base layer.

Figure 13:
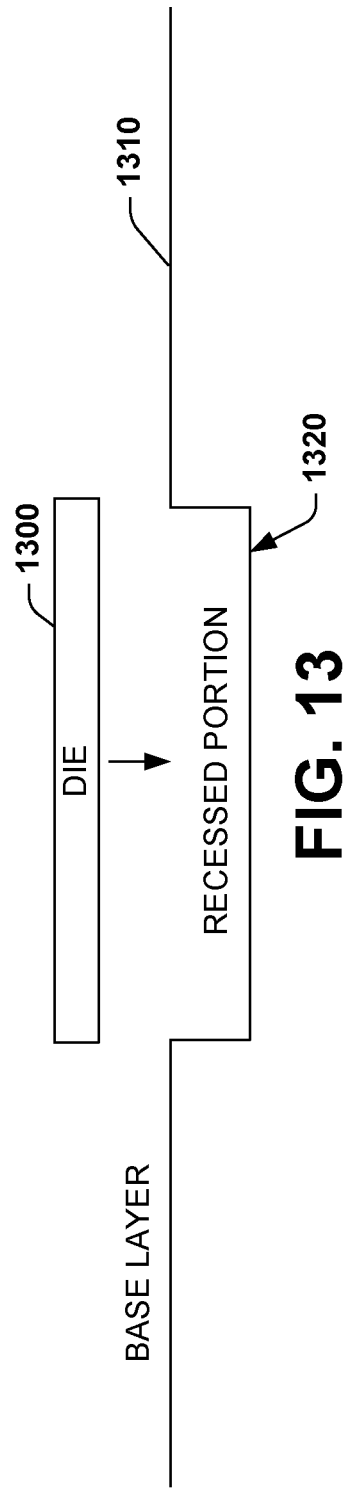
FIG. 13 illustrates an alternative coplanar assembly process between a die and a base layer.

FIG. 13 illustrates an alternative coplanar assembly process between a die 1300 and a base layer 1310. As shown, the base layer includes a recessed portion 1320 where the die 1300 can be installed. The die 1300 can be assembled into a pre-formed pocket or recessed portion 1320 formed in the base layer 1310, where the die should be sufficiently planar, and no appreciable gap should exist between the die edge and the base layer edge. To achieve this in one example, a small amount of adhesive can be stamped into the recessed portion 1320 (or needle dispensed around the perimeter of the recessed portion). The amount of adhesive can be tuned to ensure a slightly proud adhesive, or nearly flush. After the die 1300 is placed into the recessed portion 1320, a film that is designed to not stick to the adhesive during cure such as Teflon coated films can be used to "planarize" the perimeter where the die edge meets the base layer 1310 during cure. Subsequently this film can be peeled off, leaving a sufficiently co-planar and no appreciable gap between the die 1300 and the base layer 1310. Another example approach can be to use the channel layer itself as a planarizing film to mitigate this gap. In this case, if there is a small step at the edge of the die 1300, a thick film (e.g., 2-4 um) of polymer material may be used to fill in this small gap (e.g., <10 um), and attempt to planarize between the die and base layer.

Figure 14:
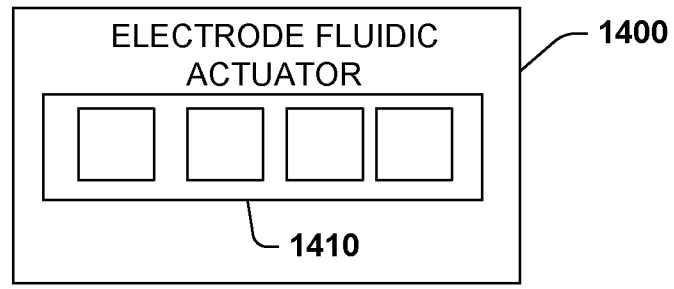
FIGS. 14 though 16 illustrate example fluidic actuators.

FIGS. 14 though 16 illustrate example fluidic actuators. FIG. 14 shows a fluidic actuator 1400 where electrodes 1410 are provided to control fluid flow across the surface of one or more die. Fluid droplets can be formed using the surface tension properties of liquid. For example, water placed on a hydrophobic surface will lower its contact with the surface by creating drops whose contact angle with the substrate can increase as the hydrophobicity increases. However, in some cases it is possible to control the hydrophobicity of the substrate by using electrical fields which are provided by the electrodes. This is sometimes referred to as "Electro-wetting On Dielectric" or EWOD. Such electrode implementations can be referred to as digital micro-fluidic applications.

Figure 15:
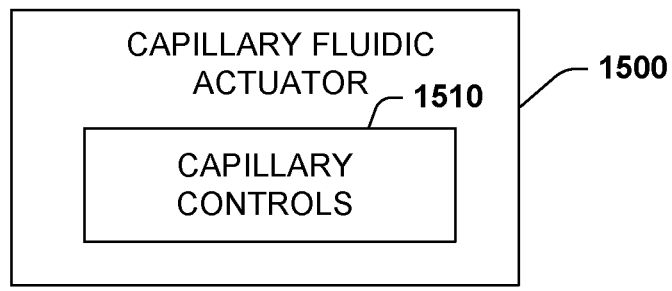
Figure 16:
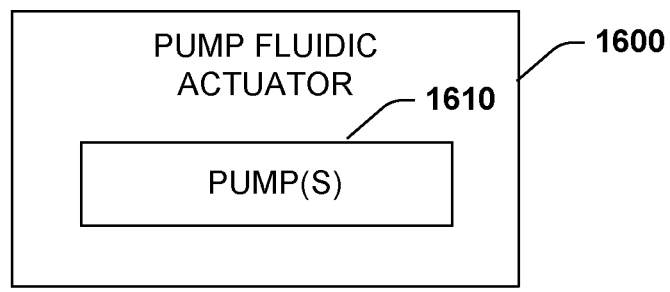

FIG. 15 illustrates another example of a fluidic actuator 1500 using a capillary fluidic actuator 1510 (or actuators). Such actuators 1510 can control fluids by capillary controls such as heating or cooling elements that can be fabricated within the die described herein. These capillary controls can include electro-osmotic flow control with patterned electrodes or heaters to drive evaporators, for example. FIG. 16 illustrates yet another example of a fluidic actuator 1600 that can be a pump actuator (or actuators) such as shown at 1610. Each of the actuators described in FIGS. 14 though 16 can be fabricated within the dies described herein and/or can be fabricated as a separate MEMS layer with is then affixed to the die, for example.

What have been described above are examples. One of ordinary skill in the art will recognize that many further combinations and permutations are possible. Accordingly, this disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An apparatus, comprising:
    a polymer base layer having a top surface;
    a die having a top surface that is substantially coplanar with the top surface of the polymer base layer, the die includes a fluidic actuator to control fluid flow across the top surface of the die; and a fluidic channel coupled to the polymer base layer to provide a fluidic interconnect between the die and a fluidic input/output (I/O) port.

2. The apparatus of claim 1, wherein the polymer base layer comprises an Epoxy Molding Compound (EMC).

3. The apparatus of claim 1, wherein the fluidic channel is at least partially disposed in the polymer base layer or is a separate layer from the polymer base layer.

4. The apparatus of claim 1, wherein the die includes side edges that extends longitudinally between spaced ends of the die, each side edge at the coplanar surface of the die contact each adjacent edge of the polymer base layer.

5. The apparatus of claim 4, further comprising an input/output port coupled to the fluidic channel to exchange fluid with the fluidic channel, the input/output port being formed of Cyclic Olefin Polymer (COP) or Cyclic Olefin Copolymer (COC).

6. The apparatus of claim 4, further comprising at least one other fluidic channel coupled to the polymer base layer, each of the fluidic channels are spaced in parallel with respect to each other and extend longitudinally from a respective I/O port toward the die.

7. The apparatus of claim 5, further comprising a Micro-Electro-Mechanical Systems (MEMS) layer on a surface of the die, the MEMS layer having a surface that is substantially coplanar with the top surface of the polymer base layer.

8. The apparatus of claim 1, further comprising at least one other die that resides in the polymer base layer and having a fluid transport path that is aligned with respect to a fluid transport path of another die to enable routing of fluids in more than one co-planar dimension.

9. The apparatus of claim 1, wherein the fluidic actuator is an electrode actuator, a capillary actuator, or a pump actuator.

10. An apparatus, comprising:

a polymer base layer having a top surface;

a die integrated into the polymer base layer, the die having a top surface that is substantially coplanar with the top surface of the polymer base layer, the die includes circuitry to control fluid flow across the top surface of the die; and a fluidic channel on top of the die fluidly coupled with an input/output (I/O) port and supported by the polymer base layer at a location spaced apart from the die, the fluidic channel extending longitudinally from the I/O port to fluidly couple with the die and provide a fluidic interconnect between the die and the I/O port.

11. The apparatus of claim 10, wherein the fluidic channel is at least partially disposed in the polymer base layer or is a separate layer from the polymer base layer.

12. The apparatus of claim 10, wherein the die includes side edges that extends longitudinally between spaced ends of the die, each side edge at the surface of the die and polymer base layer contact each adjacent edge of the polymer base layer to provide coplanar abutting surfaces.

13. The apparatus of claim 10, further comprising a Micro-Electro-Mechanical Systems (MEMS) layer on a surface of the die, the MEMS layer having a surface that is substantially coplanar with the surface of the polymer base layer.

14. A system, comprising:

a polymer base layer having a top surface;

a silicon die that is molded into the polymer base layer, the silicon die having a top surface that is substantially coplanar with the top surface of the polymer base layer, the silicon die controls fluid flow across the top surface of the silicon die;

a number of electrodes within the silicon die to route fluid across the top surface of the silicon die; and multiple fluidic channels on top of the silicon die, the multiple fluidic channels to provide a fluidic interconnect between the silicon die and multiple input/output (I/O) ports, wherein adjacent channels are coupled to I/O ports on opposite sides of the silicon die.

15. The system of claim 14, wherein the fluidic channel is at least partially disposed in the polymer base layer.

16. The apparatus of claim 10, further comprising an opening in the fluidic channel to enable fluid flow from the fluidic channel to the die.

17. The apparatus of claim 1, wherein the die is disposed in a layer on top of the polymer base layer.

18. The apparatus of claim 1, further comprising a first set of I/O ports disposed on a first side of the die and a second set of I/O ports disposed on a second side of the die, wherein I/O ports of the sets alternate along a width of the polymer base layer.

19. The apparatus of claim 1, further comprising a second die, wherein the die and the second die are positioned along different axes.

20. The apparatus of claim 19, wherein the second die and a third die comprise electrodes of different sizes.

* * * * *